(12) United States Patent
Starosvetsky et al.

(10) Patent No.: US 6,521,118 B1
(45) Date of Patent: Feb. 18, 2003

(54) SEMICONDUCTOR ETCHING PROCESS AND APPARATUS

(75) Inventors: David Starosvetsky, Yokneam Ilit (IL); Mark Kovler, Nesher (IL); Joseph Yahalom, Haifa (IL); Yael Nemirovsky, Haifa (IL)

(73) Assignee: Technion Research and Development Foundation, Haifa (IL)

( * ) Notice: Subject to any disclaimer, the term of this patent is extended or adjusted under 35 U.S.C. 154(b) by 0 days.

(21) Appl. No.: 09/600,376

(22) PCT Filed: Jan. 6, 1999

(86) PCT No.: PCT/IL99/00011
§ 371 (c)(1),
(2), (4) Date: Nov. 22, 2000

(87) PCT Pub. No.: WO99/36599
PCT Pub. Date: Jul. 22, 1999

(30) Foreign Application Priority Data

Jan. 14, 1998 (IL) .................................................. 122937

(51) Int. Cl.$^7$ ................................................. C25F 3/00
(52) U.S. Cl. ..................................... 205/655; 205/656
(58) Field of Search ................................. 205/655, 656; 204/224 M (56) References Cited

U.S. PATENT DOCUMENTS

| 5,338,416 A | 8/1994 | Mlcak et al. ............ 204/129.3 |
| 5,348,627 A | 9/1994 | Propst et al. ............ 204/129.3 |
| 5,431,766 A | 7/1995 | Propst et al. ............... 156/345 |

OTHER PUBLICATIONS

H. Gerischer and W. Mindt, "The Mechanisms of the Decomposition of Semiconductors by Electrochemical Oxidation and Reduction", *Electochimica Acta*, 13, 1968, Pergamon Press, North Ireland, pp. 1329–1341, No month provided.

O.J. Glembocki et al., "Bias–Dependent Etching of Silicon in Aqueous KOH", *Journal of Electrochemical Society*, Jan. 1985, 132(1), pp. 145–151.

H. Seidel, "The Mechanism of Electrochemical and Anisotropic Silicon Etching and its Applications", *Integrated Micro–Motion Systems—Micromachining, Control and Applications*, F. Haraschima (Editor), Elsevier Science Publishers B.V., 1990, pp. 51–69, No month provided.

*Primary Examiner*—Nam Nguyen
*Assistant Examiner*—Thomas H. Parsons
(74) *Attorney, Agent, or Firm*—Ladas & Parry (57) ABSTRACT

There is provided a process for etching a semiconductor material, comprising the steps of: providing an electrochemical cell containing an etching electrolyte, the etching electrolyte being selected from the group of acidic electrolyte solutions, alkaline solutions, neutral solutions, and molten electrolytes; immersing the semiconductor material in the etching electrolyte, whereby at least one surface of the semiconductor material contacts the etching electrolyte; thereafter negatively biasing the semiconductor material; and while continuing to negatively bias the semiconductor material, illuminating at least part of the at least one surface of the semiconductor material which contacts the etching electrolyte with light selected from the group of ultraviolet, visible, and infrared light. There is also provided an apparatus for effecting the process of the invention, as well as semiconductor materials so etched.

68 Claims, 4 Drawing Sheets

SEMICONDUCTOR ETCHING PROCESS AND APPARATUS

BACKGROUND OF THE INVENTION

1. Field of the Invention

The present invention relates to a method and apparatus for etching semiconductor materials.

2. Description of the Related Art

Many devices fabricated from silicon and other semiconductors must be truly three-dimensional. Some examples of these three-dimensional devices include micromechanical sensors and actuators, electrostatically driven micro-motors, and valve systems. Other three-dimensional structures are optical gratings and lenses, isolation trenches, mesas and via holes.

Three-dimensional structures formed from silicon and other semiconductor substrates are generally produced by anisotropic etching processes. At present, silicon is usually removed by simple chemical etching, that is, by immersing silicon specimens in a liquid bath of the chemical etchants. These are usually hydrofluoric solutions, strong alkalis such as KOH, or ethylene diamine-pirocathecol (EDP).

There are several limitations inherent in the etching techniques presently known and used in the art. The principal problem is a lack of control over the rate of silicon dissolution during the etching process. This lack of control restricts the utility of the micromachining methods presently known and used in the art.

Furthermore, at present, there is only one electrochemical technique which is reasonably effective in increasing the rate of silicon etching. This technique combines anodic biasing in aggressive HF solutions with illumination. However, the use of etchants like hydrofluoric acid, which are highly corrosive and environmentally hazardous, gives rise to serious problems in production and waste disposal.

In contrast to etching in HF, etching of silicon in aqueous alkaline solutions, e.g. NaOH or KOH solutions, is performed without electrical biasing. This is because the anodic biasing of silicon in alkaline solutions results in inactivation of the silicon, so that etching stops. Even in such aggressive media as KOH, silicon remains active only in a very narrow potential range more positive than corrosion potential $E_{corr}$. Biasing of silicon in this range does not significantly affect the etching rate in comparison to silicon dissolution without biasing. Thus, except when etching in HF, anodic bias is not used for etching silicon.

Little data is available concerning the electrochemical behavior of semiconductors under cathodic bias. Gerisher & Mindt, Electrochim. Acta, 13, 1329, (1968) pointed out the feasibility of the cathodic decomposition of semiconductors. Additionally, they showed the reduction of such semiconductors as ZnO, CdO, CuS, etc. to their metal states.

It has also been shown by Glembocki et al., J. Electrochem. Soc., Vol. 132, 145–151 (1985), and by Seidel, in "Integrated Micro-Motion Systems—Micromachining, Control and Applications," F. Harashima, Ed.; Elsevier Science Publishers, B.V., 1990 pp.51–68, that applying cathodic bias to silicon causes a decrease in the dissolution rate of n-type silicon and has almost no affect on the dissolution of p-type specimens. These experiments were carried out in KOH solutions in the potential range from –6 to +0.5 V relative to the open circuit potential (OCP).

Accordingly, there is a need for an improved method for micromachining three-dimensional structures that is electrochemically controlled, more versatile, and safer to the environment.

SUMMARY OF THE INVENTION

The present invention seeks to provide an improved method for etching three-dimensional structures in semiconductor materials, which method enables greater control of the rate of the etching process, is applicable to a wider variety of semiconductor materials, and is environmentally safer than etching methods currently known and in use in the art.

There is thus provided, in accordance with a preferred embodiment of the invention, a process for etching a semiconductor material, comprising the steps of (a) providing an electrochemical cell containing an etching electrolyte, the etching electrolyte being selected from the group of acidic electrolyte solutions, alkaline solutions, neutral solutions, and molten electrolytes;

(b) immersing the semiconductor material in the etching electrolyte, whereby at least one surface of the semiconductor material contacts the etching electrolyte;

(c) after step (b), negatively biasing the semiconductor material; and (d) while negatively biasing the semiconductor material, illuminating at least part of the at least one surface of the semiconductor material which contacts the etching electrolyte with light selected from the group of ultraviolet, visible, and infrared light.

In one preferred embodiment of the invention, the etching electrolyte is selected from among acidic aqueous solutions, alkaline aqueous solutions, and neutral aqueous solutions. In another preferred embodiment of the invention, the etching electrolyte is a molten salt.

In another preferred embodiment of the invention, the semiconductor material is masked and patterned prior to immersion. In accordance with this preferred embodiment of the invention, the process of the invention comprises the steps of:

(i) providing an electrochemical cell containing an etching electrolyte, the etching electrolyte being selected from the group of acidic electrolyte solutions, alkaline solutions, neutral solutions, and molten electrolytes;

(ii) masking and patterning the semiconductor material with a masking material which is electrically insulating and less susceptible to the etching electrolyte than is the semiconductor material, whereby to provide a masked semiconductor material having at least one masked and at least one exposed surface;

(iii) immersing the masked semiconductor material in the etching electrolyte, whereby at least one exposed surface of the masked semiconductor material contacts the etching electrolyte;

(iv) after step (iii), negatively biasing the masked semiconductor material until the potential reaches a negative voltage value; and (v) while negatively biasing the masked semiconductor material, illuminating at least part of the at least one exposed surface of the masked semiconductor material which contacts the etching electrolyte with light selected from the group of ultraviolet, visible, and infrared light.

In one preferred embodiment of the invention, step (ii) of the process comprises masking and patterning the semiconductor material with a masking material which is inert to the etching electrolyte.

In another preferred embodiment of the invention, step (b), or correspondingly, step (iii) of the process comprises immersing the semiconductor material in the etching electrolyte, until the open circuit potential of the semiconductor material reaches a steady state value. This preferred embodiment is especially preferred when the etching electrolyte is a strong alkaline solution, such as KOH. In yet another preferred embodiment of the invention, the semiconductor material is immersed in the etching electrolyte until the open circuit potential of the semiconductor material reaches a value of minus 1.1 V or a value more negative than minus 1.1 V, preferably from about minus 1.1 V to about minus 1.5 V, with respect to a Standard Calomel Electrode (SCE). This preferred embodiment is also especially preferred when the etching electrolyte is a strong alkaline solution, such as KOH.

In another preferred embodiment of the invention, step (c), or correspondingly, step (iv) of the process comprises negatively biasing the semiconductor material until the potential reaches a value of about minus 5 volts (SCE) or a value more negative than minus 5 volts (SCE).

In still another preferred embodiment of the invention, step (d), or correspondingly, step (v) of the process comprises illuminating the semiconductor material with light selected from the group of ultraviolet, visible, and infrared fight while negatively biasing said semiconductor material to a potential of about minus 5 volts (SCE) or a value more negative than minus 5 volts (SCE).

Thus, in an especially preferred embodiment of the invention, the process comprises:
(a) providing an electrochemical cell containing an etching electrolyte, the etching electrolyte being selected from the group of acidic electrolyte solutions, alkaline solutions, neutral solutions, and molten electrolytes;
(b) immersing the semiconductor material in the etching solution, whereby at least one surface of the semiconductor material contacts the etching electrolyte, until the open circuit potential of the semiconductor material reaches a steady state value;
(c) after step (b), negatively biasing the semiconductor material until the potential reaches minus 5 volts or more negative than minus 5 volts (SCE); and
(d) while negatively biasing the semiconductor material to a potential of minus 5 volts or more negative than minus 5 volts (SCE), illuminating at least part of the at least one surface of the semiconductor material which contacts the etching electrolyte with light selected from the group of ultraviolet, visible, and infrared light.

In another especially preferred embodiment of the invention, the process comprises:
(i) providing an electrochemical cell containing an etching electrolyte, the etching electrolyte being selected from the group of acidic electrolyte solutions, alkaline solutions, neutral solutions, and molten electrolytes;
(ii) masking and patterning the semiconductor material with a material which is inert to the etching electrolyte, whereby to provide a masked semiconductor material having at least one masked surface and at least one exposed surface;
(iii) after step (ii), immersing the masked semiconductor material in the etching electrolyte, whereby at least one of the at least one exposed surfaces of the masked semiconductor material contacts the etching electrolyte, until the open circuit potential of the masked semiconductor material reaches a steady state value;
(iv) after step (iii), negatively biasing the masked semiconductor material until the potential reaches minus 5 volts or more negative than minus 5 volts (SCE); and
(v) while negatively biasing the semiconductor material to a potential of minus 5 volts or more negative than minus 5 volts (SCE), illuminating at least part of the at least one exposed surface of the semiconductor material which contacts the etching electrolyte with light selected from the group of ultraviolet, visible, and infrared light.

In yet another especially preferred embodiment of the invention, the process comprises:
(a) providing an electrochemical cell containing an etching electrolyte, the etching electrolyte being selected from the group of acidic electrolyte solutions, alkaline solutions, neutral solutions, and molten electrolytes;
(b) immersing the semiconductor material in the etching electrolyte, whereby at least one surface of the semiconductor material contacts the etching electrolyte, until the open circuit potential of the semiconductor material reaches a value of about minus 1.1 V or a value more negative than minus 1.1 volts;
(c) after step (d), negatively biasing the semiconductor material until the potential reaches a value of minus 5 volts or a value more negative than −5 volts (SCE); and
(d) while negatively biasing the semiconductor material to a potential of value minus 5 volts or a value more negative than minus 5 volts (SCE), illuminating at least part of the at least one surface of the semiconductor material which contacts the etching electrolyte with light selected from the group of ultraviolet, visible, and infrared light.

In still another especially preferred embodiment of the invention, the process comprises:
(i) providing an electrochemical cell containing an etching electrolyte, the etching electrolyte being selected from the group of acidic electrolyte solutions, alkaline solutions, neutral solutions, and molten electrolytes;
(ii) masking and patterning the semiconductor material with a material which is inert to the etching electrolyte, whereby to provide a masked semiconductor material having at least one masked surface and at least one exposed surface;
(iii) after step (ii), immersing the masked semiconductor material in the etching electrolyte, whereby at least one of the at least one exposed surfaces of the masked semiconductor material contacts the etching electrolyte, until the open circuit potential of the masked semiconductor material reaches a value of about minus 1.1 V or a value more negative than minus 1.1 volts;
(iv) after step (iii), negatively biasing the masked semiconductor material until the potential reaches minus 5 volts or more negative than −5 volts (SCE); and
(v) while negatively biasing the masked semiconductor material to a potential of minus 5 volts or more negative than minus 5 volts (SCE), illuminating at least part of the at least one exposed surface of the semiconductor material which contacts the etching electrolyte with light selected from the group of ultraviolet, visible, and infrared light.

In a preferred embodiment of the invention, the illumination is supplied in such a manner that the intensity of the illumination, when measured in air at a point the same distance from the illumination source as the semiconductor material when the semiconductor material is immersed in the electrolytic cell, is at least 0.01 Watt/cm$^2$.

In a preferred embodiment of the invention, the semiconductor material is selected from the group consisting of silicon, germanium, and semiconductors in the III-V and II-VI groups of semiconductors. By "III-V group of semiconductors" is meant semiconductors consisting substantially of (i) one or more elements from column IIIA of the periodic table and (ii) one or more elements from column VA of the periodic table, for example gallium arsenide. By "II-VI group of semiconductors" is meant semiconductors consisting substantially of one or more elements from column IIA of the periodic table and one or more elements from column VIA of the periodic table, for example cadmium telluride.

In another preferred embodiment of the invention, the etching electrolyte is a solution containing a solute selected from the group consisting of alkali hydroxides, alkali halogenides and hydrogen halogenide acids, more preferably KOH, NaOH NaCl, and HF. In a more preferred embodiment, the solution is an aqueous solution. In an especially preferred embodiment, the aqueous solution is a neutral solution which is not harmful to laboratory or industrial equipment, and is not harmful to the touch.

In a preferred embodiment of the invention, the masked semiconductor material is illuminated with light with a wavelength between about 250 and about 1500 nm. In another preferred embodiment of the invention, the light is of intensity of at least 0.01 W/cm$^2$.

In another preferred embodiment of the invention, the temperature of the solution is between about 25 and 90° C., more preferably between about 50° C. and about 90° C.

In accordance with another preferred embodiment of the invention, there is provided an apparatus for electrochemically etching semiconductor materials, comprising an electrochemical cell, a holder for holding the semiconductor material and providing an electrical contact to the semiconductor material in the electrochemical cell, a counter electrode, a variable power source for variably biasing the semiconductor material when held in the electrochemical cell by the holder, and a light source, the electrochemical cell and the light source being mutually configured so as to enable direction of the light from the light source onto the semiconductor material held by the holder in the electrochemical cell.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
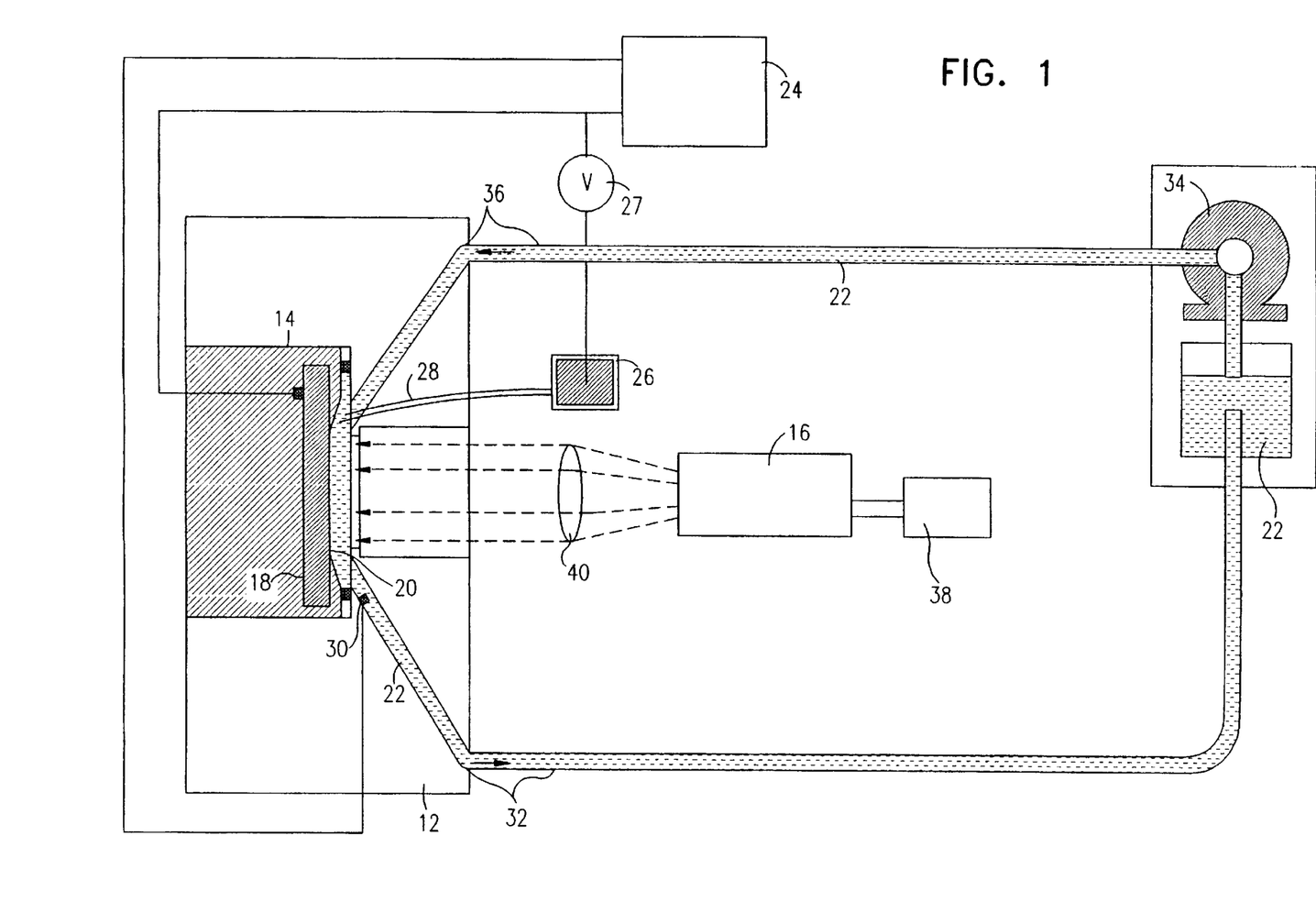
FIG. 1 is a schematic view of a preferred electrochemical machining cell.

Reference is now made to FIG. 1, which shows an electrochemical apparatus according to one preferred embodiment of the invention. The apparatus is constructed from an electrochemical flow-cell 12 made of glass or other suitable material, a sample holder 14, and a light source 16. The sample holder is made of suitable substantially inert material, such as polyfluoroethylene or Teflon®. A sample 18 of semiconductor material to be etched is mounted on holder 14, exposing surface 20 of sample 18 to etching electrolyte 22. If the sample has been masked and patterned prior to being placed in the holder, only those portions of surface 20 which have not been masked will be exposed to the etching electrolyte 22.

A power supply 24 is used to variably bias the sample 18 with respect to an optional reference electrode 26; the potential at the reference electrode may be monitored using a voltmeter 27 connected between power supply 24 and reference electrode 26. As shown in FIG. 1, the reference electrode is connected to the cell via a Luggin capillary 28, although other types of electrolytic bridges will be readily envisioned by artisans of ordinary skill. A counter-electrode 30, which is preferably formed from an electrically conductive material which is inert to the etching solution, is affixed in an electrolyte outlet tube 32. The etching electrolyte 22 may be pumped through the cell 12 by a suitable pump 34, preferably a flow-controlled peristaltic pump, via inlet tube 36. Electrical contact may be improved between the sample and the rest of the system by applying an appropriate conducting material, such as In—Ga amalgam, to the point of contact between the semiconductor sample and the holder.

The light source 16, controlled by a power supply 38, is used to illuminate the sample. The light source 16 is arranged with respect to the rest of the apparatus in such a way that the light from 16 falls on surface 20 with the requisite intensity, including the placement of any necessary optics 40.

If it is desired to heat the etching electrolyte, this may be accomplished by standard methods known in the art, for example by immersion of an electrically insulated heating element into the etching solution, or by placing the exterior of the electrochemical cell in contact with a heat source.

As stated above, in a preferred embodiment, the process for etching a semiconductor material in accordance with the invention comprises the steps of:

(a) providing an electrochemical cell containing an etching electrolyte, the etching electrolyte being selected from the group of acidic electrolyte solutions, alkaline solutions, neutral solutions, and molten electrolytes;

(b) immersing the semiconductor material into the etching solution, whereby at least one surface of the semiconductor material contacts the etching electrolyte, optionally until the open circuit potential of the semiconductor material reaches a steady state value;

(c) after step (b), negatively biasing the semiconductor material until the potential reaches a value of minus 5 volts or a value more negative than minus 5 volts (SCE); and (d) while negatively biasing the semiconductor material to a potential of minus 5 volts or a potential more negative than minus 5 volts (SCE), illuminating at least part of the at least one surface of the masked semiconductor material which contacts the etching electrolyte with infrared, visible, or ultraviolet light.

Also as stated above, in a preferred embodiment, in another variant, the process for etching a semiconductor material in accordance with the invention comprises the steps of:

(i) providing an electrochemical cell containing an etching electrolyte, the etching electrolyte being selected from the group of acidic electrolyte solutions, alkaline solutions, neutral solutions, and molten electrolytes;

(ii) masking and patterning the semiconductor material to be etched with a masking material which is inert to the aqueous solution, whereby to produce a masked semiconductor material having at least one exposed surface and at least one masked surface;

(iii) after step (ii), immersing the masked semiconductor material into the etching solution, whereby at least one of the at least one exposed surfaces of the semiconductor material contacts the etching electrolyte, optionally until the open circuit potential of the semiconductor material reaches a steady state value;

(iv) after step (iii), negatively biasing the masked semiconductor material until the potential reaches a value of minus 5 volts or a value more negative than minus 5 volts (SCE); and (v) while negatively biasing the masked semiconductor material to a potential of minus 5 volts or a potential more negative than minus 5 volts (SCE), illuminating at least part of the at least one surface of the masked semiconductor material which contacts the etching electrolyte with infrared, visible, or ultraviolet light.

The semiconductor material to be etched in accordance with the invention may be any semiconductor material susceptible to electrochemical etching. As stated, the semiconductor material is preferably selected from the group consisting of silicon, germanium, and semiconductors in the III-V and II-VI groups of semiconductors, as hereinbefore defined, such as gallium arsenide and cadmium telluride.

While the present invention may be carried out using etching electrolytes which are acidic or alkaline solutions, such as aqueous acidic or aqueous alkaline solutions, as well as molten electrolytes, such as salt melts, an advantage of the present method over etching methods known in the art is that the present invention may be carried out using neutral media, such as alcoholic media, preferably neutral aqueous media, containing dissolved ions and which are electrically conductive, such as dilute NaCl solutions. Such media present little or no threat to human health, nor do they present the reactor engineering problems of acidic or alkaline solutions, which are often corrosive. Thus, for example, while the etching electrolyte used may be an aqueous solution containing a solute selected from the group consisting of hydrogen halogenide acid and alkali hydroxides, such as HF, NaOH, and KOH, the solution may instead be an aqueous solution containing an alkali halogenide or alkaline earth metal halogenide, such as NaCl, $CaCl_2$, $MgCl_2$, or other salt which is relatively safe to humans, e.g. various sulfates and organic salts, as the solute.

Furthermore, the concentration of salt in neutral solutions is not critical: concentrations of as low as 0.001 M are sufficient to enable practice of the invention.

The masking and patterning of semiconductor materials is well-known in the art. As in known etching processes, semiconductor materials used in accordance with the present invention are masked and patterned with one or more masking materials (such as $Si_3N_4$ or $SiO_2$), which are less susceptible to the chosen electrolyte than is the semiconductor material. In one preferred embodiment of the invention, the one or more masking materials are inert to the chosen electrolyte. It should be noted that the sample holder itself, which holds the semiconductor material during the etching process, may be formed in such a way so as to function as a mask.

It should be noted that the steps of masking and patterning are not always necessary. In cases when the whole surface of the semiconductor material is to be etched, such in the making of a sharp edge, no masking may be necessary.

Although the invention may be practiced using light of any effective wavelength, in a preferred embodiment of the invention the semiconductor material is illuminated with light with a wavelength between about 250 and 1500 nm. The intensity of the light may be any effective intensity, but preferably the intensity is at least 0.01 $W/cm^2$, as measured at a point in the air located the same distance from the illumination source as is the semiconductor material when the semiconductor material is immersed in the electrolytic cell. By selectively illuminating different regions of the exposed semiconductor surface area, e.g. with a laser, it is possible to selectively etch different regions of the silicon surface. The selective illumination technique may be employed in lieu of or as an adjunct to masking techniques.

When the etching electrolyte is a solution, e.g. an aqueous solution, the invention may be practiced at any temperature between the freezing point and boiling point of the solution. In a preferred embodiment of the invention, when the etching electrolyte is an aqueous solution, the temperature of the aqueous solution is between about 25° C. and about 90° C., more preferably between about 50° C. and about 90° C.

The foregoing description will be better understood through the following illustrative and non-limitative examples.

EXAMPLE 1

A low doped p-type silicon wafer was masked sequentially with a 20 nm layer of $SiO_2$, a 20 nm layer of $Si_3N_4$, and a 1000 nm layer of $SiO_2$, and patterned by a standard photolithographic process. Ohmic contacts were made on the back side of the silicon surface prior to mounting in the holder.

The masked wafer was placed in an electrolytic cell similar to the one shown in FIG. 1, so that it was immersed in a solution of 24 wt. % NaOH at 60° C. Once the open circuit potential (OCP) reached a value of minus 1.34 volts (SCE), the masked wafer was negatively biased at minus 10 V (SCE). Under these conditions, the etching rate achieved was found to be 13 micron/hour (the exposed surface was etched to a depth of 13 micron per hour of etching).

Using the same procedure, but, while negatively biasing the masked wafer, simultaneously illuminating the masked wafer by a 4 $W/cm^2$ collimated beam of a tungsten-halogen lamp, the etching rate was found to be 21 micron/hour.

EXAMPLE 2

Example 1 was repeated, but the masked wafer was negatively biased to minus 30 V (SCE). The etching rate without illumination was found to be 13 micron/hour, and with illumination it was 38 micron/hour.

EXAMPLE 3

Example 1 was repeated, but the masked wafer was negatively biased to minus 50 V (SCE). The etching rate without illumination was found to be 13 micron/hour, and with illumination it was 63 micron/hour.

EXAMPLE 4

Example 2 was repeated, but using a 20 wt. % KOH solution at 30° C. The etching rates in the absence and the presence of illumination were found to be 0.8 and 4 micron/hour respectively.

EXAMPLE 5

Figure 3:
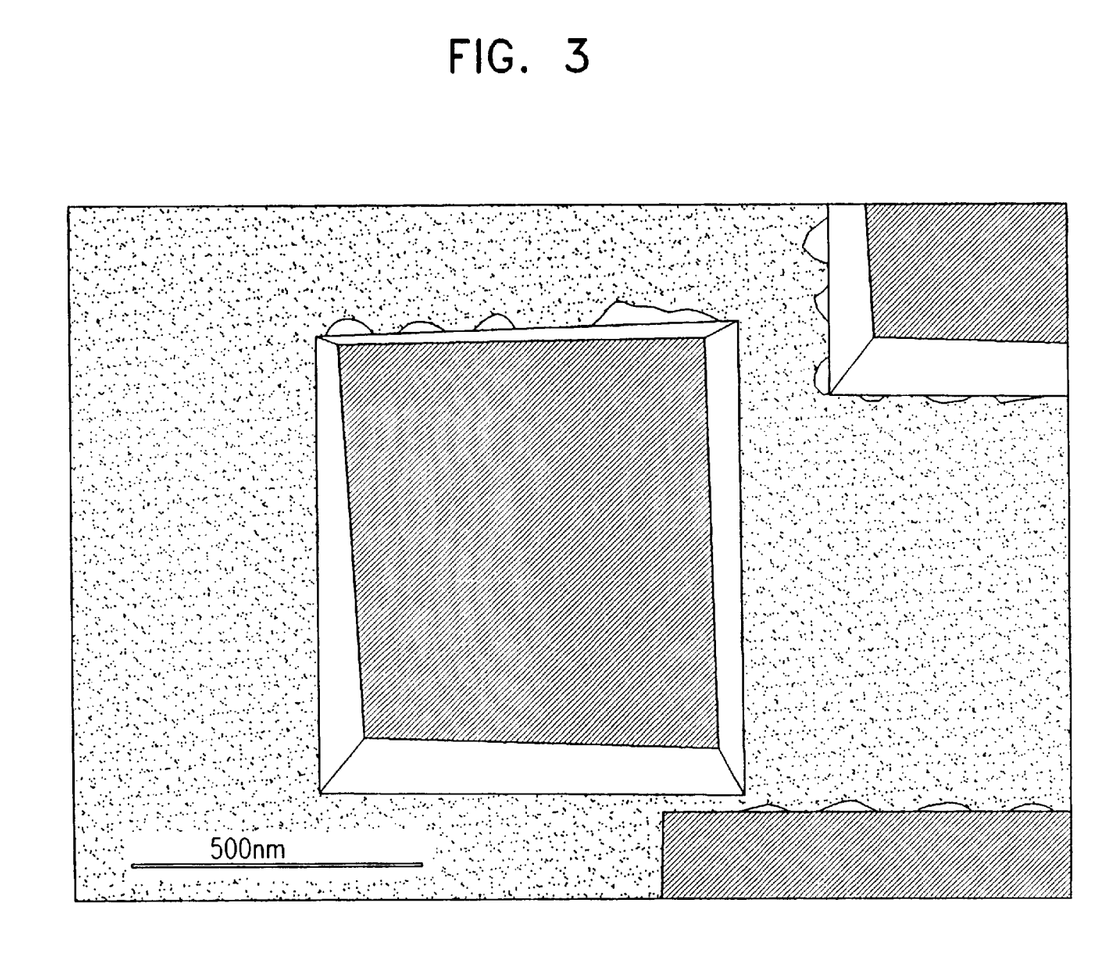
FIG. 3 presents a scanning electron microscope (SEM) micrograph of silicon etched in deionized water containing small additions of NaCl, in accordance with the invention.

Low doped p-type silicon wafers were masked and patterned as in Example 1. After making an ohmic contact on the back side of the silicon surface, the wafers were placed in an electrolytic cell, using deionized water containing 5 g/l NaCl as the etching solution. The following was found:
  (a) Negative biasing of the masked wafer at minus 50V (SCE) at 25° C., without illumination, led to no detectable dissolution of silicon.
  (b) Irradiation of the masked wafer at 25° C. with 80 W/cm$^2$ of fight from a dye laser at 780 nm without applied bias led to no detectable dissolution of silicon.
  (c) Negative biasing of the masked wafer at minus 50V (SCE) at 25° C., and simultaneous illumination with 80 W/cm$^2$ of light from a dye laser at 780 nm yielded an etching rate of 2 micron/hour.
  (d) Negative biasing of the masked wafer at minus 50V (SCE) at 90° C., and simultaneous illumination with 80 W/cm$^2$ of light from a dye laser at 780 nm yielded an etching rate of 19 micron/hour. FIG. 3 shows a scanning electron micrograph of the silicon sample so etched.

EXAMPLE 6

Phosphorus-doped n-type silicon wafers ($10^{15}$ atom/cm$^3$) were masked, patterned and electrochemically treated as in Example 1. The following was found:
  (a) Negative biasing of the masked wafer at minus 1.7 V (SCE) at 60° C. yielded an etching rate of 17 micron/hour.
  (b) Using the same procedure as (a), with simultaneous illumination of the masked wafer by a 4 W/cm$^2$ collimated beam a tungsten-halogen lamp, did not practically effect the etching rate.
  (c) Under the same conditions as (a) and (b), but with biasing of minus 20V (SCE), the etching rate with and without illumination was found to be 25 and 38 micron/hour, respectively.

EXAMPLE 7

A low doped p-type silicon wafer was prepared as in Example 5. The masked wafer was immersed in a solution of 24 wt. % NaOH at 60° C. until the open circuit potential (OCP) reached a value of minus 1.34 V (SCE). The masked wafer was then negatively biased at minus 5V (SCE). The etching rate achieved was found to be 13 micron/hour.

Using the same procedure, but simultaneously illuminating the masked wafer with a 4 W/cm$^2$ collimated beam of a tungsten-halogen lamp (containing light in the wavelength range of 250–1500 nm), the etching rate was found to be 63 micron/hour.

EXAMPLE 8

A p-type silicon wafer was masked and patterned, and placed in an electrolytic cell containing deionized water containing 5 g/l NaCl, as in Example 5. At minus 50 V (SCE) at 90° C., and using 780 nm dye laser irradiation, the etching rate was found to be 19 micron/hour. No etching was found under these conditions in the absence of illumination.

EXAMPLE 9

Using a sample of p-type silicon, under the same conditions as in Example 8, but using laser light of 1100 nm wavelength, the etching rate was found to be 12 micron/hour.

EXAMPLE 10

A p-type silicon wafer was masked and patterned, and placed in an electrolytic cell containing deionized water containing 5 g/l NaCl, as in Example 5. At minus 50 V (SCE) and 60° C., and using 1 W/cm$^2$ halogen lamp illumination, the etching rate was found to be 3.5 micron/hour. No etching was found under these conditions in the absence of illumination.

EXAMPLE 11

Wafers of p-type silicon were masked and patterned as described above, and placed in an electrolytic cell. The etching rate obtained at minus 50 V, at different temperatures, in different media, and using different types of illumination, are shown in Table 1.

TABLE 1

| | Etching rate, micron/hr. | | | |
| --- | --- | --- | --- | --- |
| | In 24 wt. % NaOH | | In DI water containing 5 g/l NaCl | |
| Temperature | Day-light | 4 W/cm$^2$ halogen lamp | Day-light | Dye laser-780 nm. 80 W/cm$^2$ |
| 20° C. | 0.8 | 4 | 0* | 2 |
| 60° C. | 13 | 63 | — | — |
| 90° C. | 100 | 490 | 0* | 19 |

*silicon exhibits etch-stop

Figure 2:
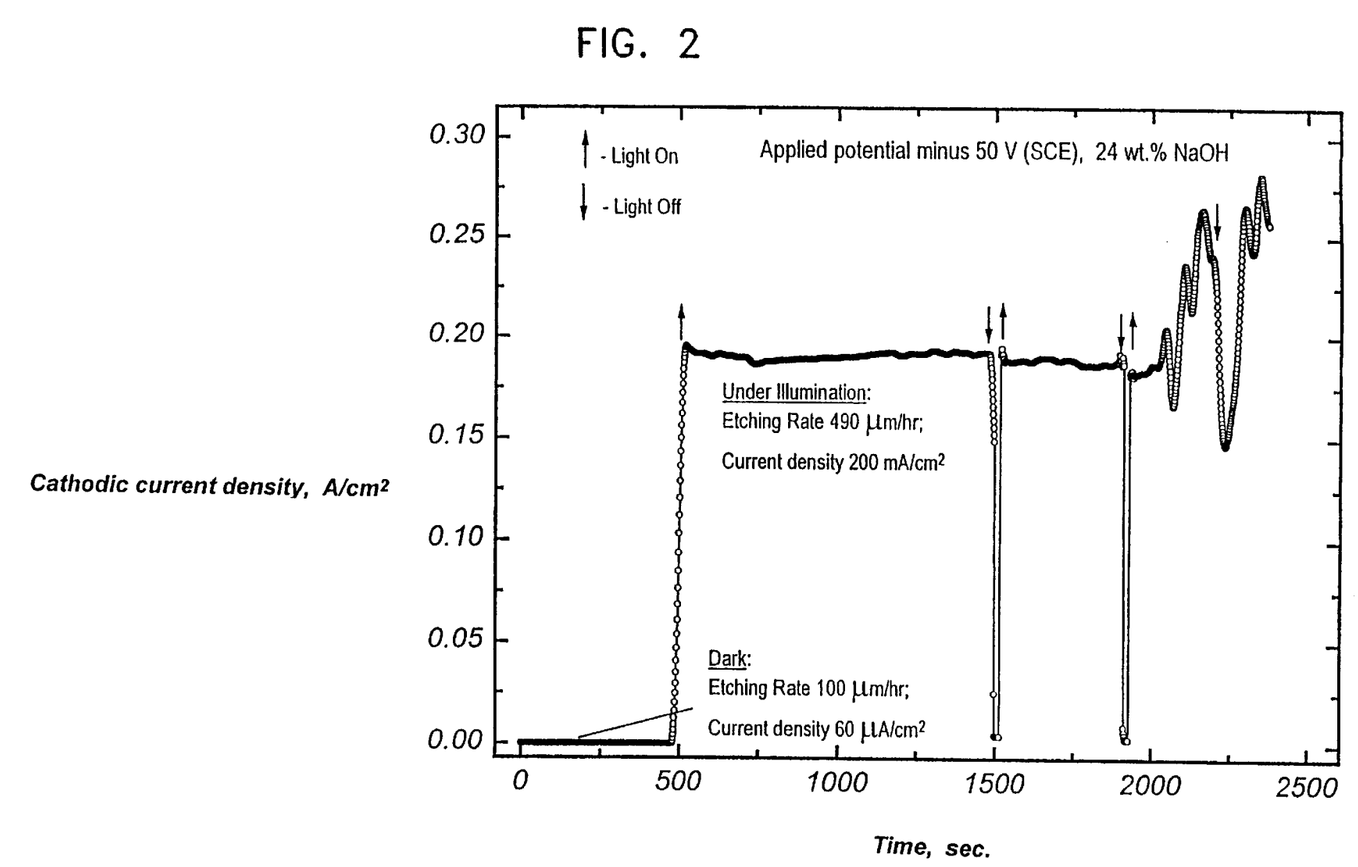
FIG. 2 shows the effect of illumination on cathodic current density and the etching rate.
Figure 4:
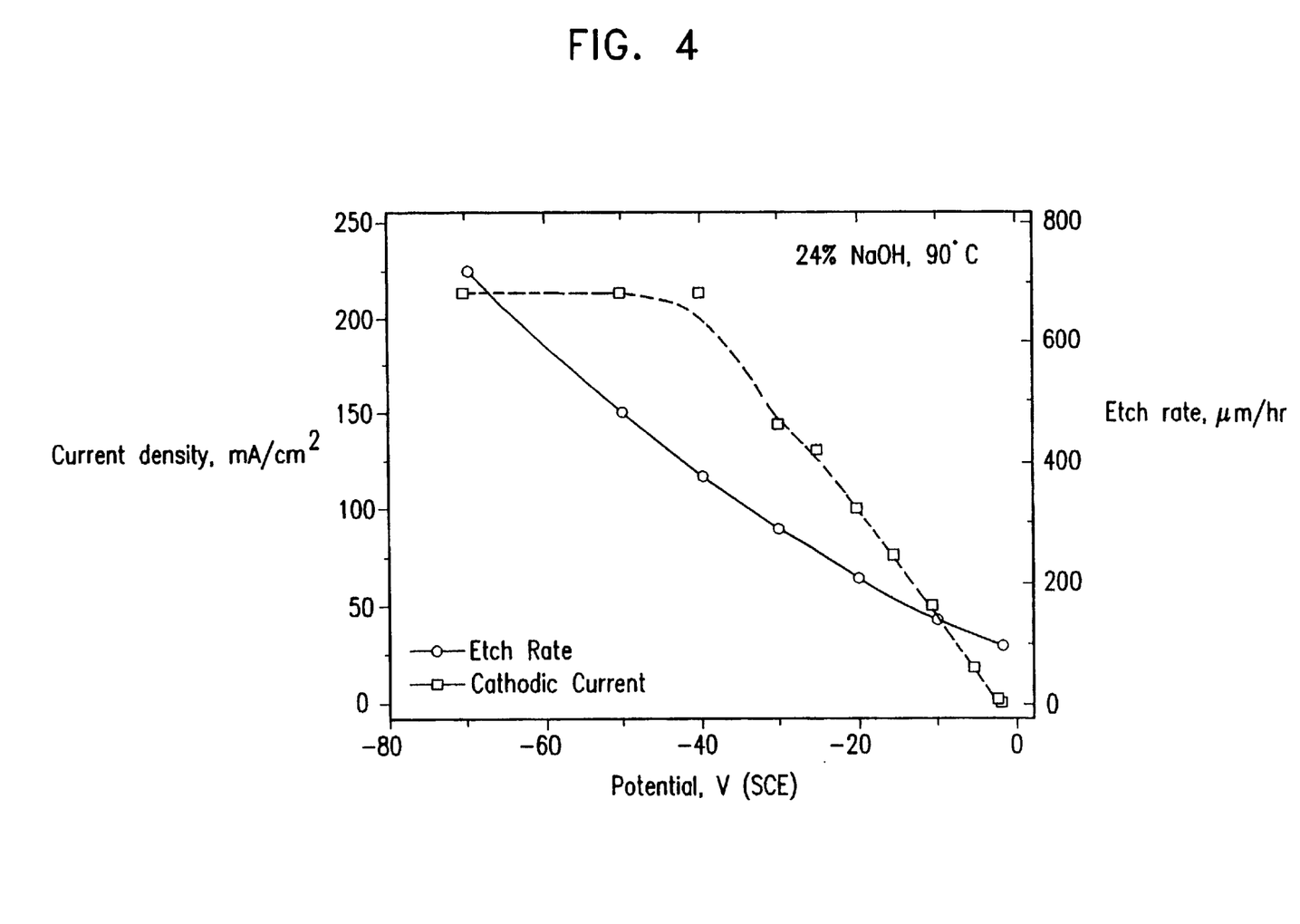
FIG. 4 shows cathodic current density and the etching rate as a function of applied potential.

FIG. 2 shows the cathodic current density as a function of time, with occasional interruption of illumination, for a sample etched in 24 wt. % NaOH at 90° C., using a 4 W/cm$^2$ tungsten-halogen lamp as the illumination source (see corresponding entry in Table 1). FIG. 4 shows both the current density and the etch rate as a function of potential for the same sample under these conditions (with continuous illumination.)

It will readily be appreciated from the foregoing examples that by varying one or more of the parameters of solution temperature, light frequency, and light intensity, it is possible to control the rate of etching of the semiconductor material.

It will be appreciated by persons skilled in the art that the present invention is not restricted to the embodiments which have been particularly described hereinabove, but that many modifications and variations thereof may be made, without departing from the spirit of the invention or its scope as defined in the preceding description and in the appended claims.

What is claimed is:

1. A process for etching a semiconductor material, comprising the steps of:
  (a) providing an electrochemical cell containing an etching electrolyte, said etching electrolyte being selected from the group consisting of acidic electrolyte solutions, alkaline solutions, neutral solutions, and molten electrolytes;
  (b) immersing said semiconductor material in said etching electrolyte, wherein at least one surface of said semiconductor material contacts said etching electrolyte, thereby defining an open circuit;
  (c) after step (b), negatively biasing said semiconductor material to a potential at least one volt more negative than that of the open circuit; and
  (d) while continuing to negatively bias said semiconductor material, illuminating at least part of said at least one surface of the semiconductor material which contacts said etching electrolyte with light selected from the group consisting of ultraviolet, visible, and infrared light.

2. A process according to claim 1 wherein step (b) comprises immersing said semiconductor material in the etching electrolyte until the open circuit potential of said semiconductor material reaches a steady state value.

3. A process according to claim 2, wherein said etching electrolyte is a strong alkaline solution.

4. A process according to claim 3, wherein said strong alkaline solution is a KOH solution.

5. A process according to claim 1, wherein step (b) comprises immersing said semiconductor material in said etching electrolyte until the open circuit potential of said semiconductor material reaches a value of about minus 1.1 V or a value more negative than minus 1.1 V, with respect to a Standard Calomel Electrode (SCE).

6. A process according to claim 5, wherein step (b) comprises immersing said semiconductor material in said etching electrolyte until the open circuit potential of said semiconductor material reaches a value of from about minus 1.1 V to about minus 1.5 V (SCE).

7. A process according to claim 5, wherein said etching electrolyte is a strong alkaline solution.

8. A process according to claim 7, wherein said alkaline solution is a KOH solution.

9. A process according to claim 1, wherein step (c) comprises negatively biasing said semiconductor material until the potential reaches a value of about minus 5 volts (SCE) or a value more negative than minus 5 volts (SCE).

10. A process according to claim 9, wherein step (d) comprises illuminating the semiconductor material with light selected from the group consisting of ultraviolet, visible, and infrared light while continuing to negatively bias said semiconductor material to a potential of about minus 5 volts (SCE) or a value more negative than minus 5 volts (SCE).

11. A process according to claim 1, comprising the steps of:
immersing said semiconductor material in said etching electrolyte, wherein at least one surface of said semiconductor material contacts said etching electrolyte, until the open circuit potential of said semiconductor material reaches a steady state value;
after the preceding step, negatively biasing said semiconductor material until the potential reaches minus 5 volts or more negative than minus 5 volts (SCE); and
while negatively biasing said semiconductor material to a potential of minus 5 volts or more negative than minus 5 volts (SCE), illuminating at least part of said at least one surface of the semiconductor material which contacts said etching electrolyte with light selected from the group consisting of ultraviolet, visible, and infrared light.

12. A process according to claim 1, comprising the steps of:
immersing said semiconductor material in said etching electrolyte, wherein at least one surface of said semiconductor material contacts said etching electrolyte, until the open circuit potential of said semiconductor material reaches from about minus 1.1 V or more negative than minus 1.1 V (SCE);
after the preceding step, negatively biasing said semiconductor material until the potential reaches minus 5 volts or more negative than minus 5 volts (SCE); and
while negatively biasing said semiconductor material to a potential of minus 5 volts or more negative than minus 5 volts (SCE), illuminating at least part of said at least one surface of the semiconductor material which contacts said etching electrolyte with light selected from the group consisting of ultraviolet, visible, and infrared light.

13. A process according to claim 1, wherein said semiconductor material is selected from the group consisting of the III-V and II-VI groups of semiconductors.

14. A process according to claim 1, wherein said semiconductor material is selected from the group consisting of silicon, germanium, gallium arsenide, and cadmium telluride.

15. A process according to claim 14, wherein said semiconductor material is p-type silicon or n-type silicon.

16. A process according to claim 1, wherein said etching electrolyte is an electrolyte which is a solution containing a solute selected from the group consisting of alkali hydroxides, alkali halogenides and hydrogen halogenide acids.

17. A process according to claim 16, wherein said solution is an aqueous solution.

18. A process according to claim 17, wherein said solute is selected from the group consisting of KOH, NaOH, NaCl, and HF.

19. A process according to claim 16, wherein said solution is a non-aqueous solution.

20. A process according to claim 19, wherein said non-aqueous solution is an alcoholic solution.

21. A process according to claim 1, wherein said etching electrolyte is a neutral aqueous solution which is not harmful to laboratory or industrial equipment, and is not harmful to the touch.

22. A process according to claim 1, wherein said etching electrolyte is a molten electrolyte.

23. A process according to claim 22, wherein said molten electrolyte is a molten salt.

24. A process according to claim 1, wherein a partly masked semiconductor material is illuminated with light having a wavelength of between about 250 and about 1500 nm.

25. A process according to claim 24, wherein source of the illuminating light is a tungsten-halogen bulb.

26. A process according to claim 24, wherein the source of the illuminating light is a dye laser.

27. A process according to claim 1, wherein a partly masked semiconductor material is illuminated with light of an intensity of at least 0.01 W/cm$^2$.

28. A process according to claim 1, wherein said etching electrolyte is a solution at a temperature between its freezing point and its boiling point.

29. A process according to claim 28, wherein said solution is an aqueous solution.

30. A process according to claim 29, wherein the temperature is between about 25° C. and about 90° C.

31. A process according to claim 30, wherein the temperature is between about 50° C. and about 90° C.

32. A process according to claim 28, wherein said solution is a non-aqueous solution.

33. A process according to claim 32, wherein said non-aqueous solution is an alcoholic solution.

34. A process according to claim 1, comprising the steps of:
(i) masking and patterning said semiconductor material with a masking material, said masking material being an electrically insulating material which is less susceptible to the etching electrolyte than is the semiconductor material, thereby to provide a masked semiconductor material having at least one masked surface and at least one exposed surface;

(ii) immersing said masked semiconductor material in said etching electrolyte, wherein at least one of said at least one exposed surfaces of said masked semiconductor material contacts said etching electrolyte;

(iii) after the preceding step, negatively biasing said masked semiconductor material until the potential reaches a negative voltage value; and (iv) while negatively biasing said masked semiconductor material, illuminating at least part of said at least one exposed surface of said masked semiconductor material which contacts said etching electrolyte with light selected from the group consisting of ultraviolet, visible, and infrared light.

35. A process according to claim 34, wherein step (i) comprises masking and patterning said semiconductor material with a masking material which is inert to said etching electrolyte.

36. A process according to claim 34 wherein step (ii) comprises immersing said masked semiconductor material in the etching electrolyte until the open circuit potential of said semiconductor material reaches a steady state value.

37. A process according to claim 36, wherein said etching electrolyte is a strong alkaline solution.

38. A process according to claim 37, wherein said strong alkaline solution is a KOH solution.

39. A process according to claim 34, wherein step (ii) comprises immersing said masked semiconductor material in said etching electrolyte until the open circuit potential of said masked semiconductor material reaches about minus 1.1 V or more negative than minus 1.1 V, with respect to a Standard Calomel Electrode (SCE).

40. A process according to claim 39, wherein step (ii) comprises immersing said masked semiconductor material in said etching electrolyte until the open circuit potential of said masked semiconductor material reaches a value of from about minus 1.1 V to about minus 1.5 V (SCE).

41. A process according to claim 39, wherein said etching electrolyte is a strong alkaline solution.

42. A process according to claim 41, wherein said strong alkaline solution is a KOH solution.

43. A process according to claim 34, wherein step (iii) comprises negatively biasing said masked semiconductor material until the potential reaches about minus 5 volts (SCE) or more negative than minus 5 volts (SCE).

44. A process according to claim 43, wherein step (iv) comprises illuminating the semiconductor material with light selected from the group consisting of ultraviolet, visible, and infrared light while continuing to negatively bias said semiconductor material to a potential of about minus 5 volts (SCE) or more negative than minus 5 volts (SCE).

45. A process according to claim 34 comprising the steps of:

masking and patterning said semiconductor material with a masking material which is inert to said etching solution, thereby to provide a masked semiconductor material having at least one masked surface and at least one exposed surface;

immersing said masked semiconductor material in said etching electrolyte, wherein at least one of said at least one exposed surfaces of said masked semiconductor material contacts said etching electrolyte, until the open circuit potential of said masked semiconductor material reaches a steady state value;

after the preceding step, negatively biasing said masked semiconductor material until the potential reaches minus 5 volts or more negative than minus 5 volts (SCE); and while negatively biasing said masked semiconductor material to a potential of minus 5 volts or more negative than minus 5 volts (SCE), illuminating at least part of said at least one exposed surface of said masked semiconductor material which contacts said etching electrolyte with light selected from the group consisting of ultraviolet, visible, and infrared light.

46. A process according to claim 34, comprising the steps of:

masking and patterning said semiconductor material with a masking material which is inert to said etching solution, thereby to provide a masked semiconductor material having at least one masked surface and at least one exposed surface;

immersing said masked semiconductor material in said etching electrolyte, wherein at least one of said at least one exposed surfaces of said masked semiconductor material contacts said etching electrolyte, until the open circuit potential of said masked semiconductor material reaches from about minus 1.1 V or more negative than minus 1.1 V (SCE);

after the preceding step, negatively biasing said masked semiconductor material until the potential reaches minus 5 volts or more negative than minus 5 volts (SCE); and while continuing to negatively bias said masked semiconductor material to a potential of minus 5 volts or more negative than minus 5 volts (SCE), illuminating at least part of said at least one exposed surface of said masked semiconductor material which contacts said etching electrolyte with light selected from the group consisting of ultraviolet, visible, and infrared light.

47. A process according to claim 34, wherein said semiconductor material is selected from the group consisting of the III-V and II-VI groups of semiconductors.

48. A process according to claim 34, wherein said semiconductor material is selected from the group consisting of silicon, germanium, gallium arsenide, and cadmium telluride.

49. A process according to claim 34, wherein said etching electrolyte is an a solution containing a solute selected from the group consisting of alkali hydroxides, alkali halogenides and hydrogen halogenide acids.

50. A process according to claim 49, wherein said solution is an aqueous solution.

51. A process according to claim 49, wherein said solution is a non-aqueous solution.

52. A process according to claim 51, wherein said non-aqueous solution is an alcoholic solution.

53. A process according to claim 49, wherein said solute is selected from the group consisting of KOH, NaOH, NaCl, and HF.

54. A process according to claim 34, wherein said etching electrolyte is a neutral aqueous solution which is not harmful to laboratory or industrial equipment, and is not harmful to the touch.

55. A process according to claim 34, wherein said etching electrolyte is a molten electrolyte.

56. A process according to claim 55, wherein said molten electrolyte is a molten salt.

57. A process according to claim 34, wherein said masked semiconductor material is illuminated with light having a wavelength of between about 250 and about 1500 nm.

58. A process according to claim 57, wherein source of the illuminating light is a tungsten-halogen bulb.

59. A process according to claim 57, wherein the source of the illuminating light is a dye laser.

60. A process according to claim 34, wherein said masked semiconductor material is illuminated with light of an intensity of at least 0.01 W/cm2.

61. A process according to claim 34, wherein said etching electrolyte is an a solution at a temperature between its freezing point and its boiling point.

62. A process according to claim 61, wherein said solution is an aqueous solution.

63. A process according to claim 62, wherein the temperature is between about 25° C. and about 90° C.

64. A process according to claim 63, wherein the temperature is between about 50° C. and about 90° C.

65. A process according to claim 61, wherein said solution is a non-aqueous solution.

66. A process according to claim 65, wherein said non-aqueous solution is an alcoholic solution.

67. An etched semiconductor material, etched by the process of:

(a) providing a semiconductor material;

(b) providing an electrochemical cell containing an etching electrolyte, said etching electrolyte being selected from the group consisting of acidic electrolyte solutions, alkaline solutions, neutral solutions, and molten electrolytes;

(c) immersing said semiconductor material in said etching electrolyte, thereby to present at least one exposed surface of the semiconductor material to said etching electrolyte, thereby defining an open circuit;

(d) after step (c), negatively biasing said semiconductor material to a potential at least one volt more negative than that of the open circuit; and (e) while continuing to negatively bias said semiconductor material, illuminating at least part of said at least one exposed surface of said semiconductor material with light selected from the group consisting of ultraviolet, visible, and infrared light.

68. A process for etching a semiconductor material formed of a single substance, comprising the steps of:

(a) providing an electrochemical cell containing an etching electrolyte, said etching electrolyte being selected from the group consisting of acidic electrolyte solutions, alkaline solutions, neutral solutions, and molten electrolytes;

(b) immersing said semiconductor material formed of a single substance in said etching electrolyte, wherein at least one surface of said semiconductor material formed of a single substance contacts said etching electrolyte, thereby defining an open circuit;

(c) after step (b), negatively biasing said semiconductor material formed of a single substance to a potential more negative than that of the open circuit; and (d) while continuing to negatively bias said semiconductor material formed of a single substance, illuminating at least part of said at least one surface of the semiconductor material formed of a single substance which contacts said etching electrolyte with light selected from the group consisting of ultraviolet, visible, and infrared light.

\* \* \* \* \*